(12) United States Patent
Yu et al.

(10) Patent No.: US 6,551,899 B1
(45) Date of Patent: Apr. 22, 2003

(54) METHODS OF FABRICATING MEMORY CELLS FOR NONVOLATILE MEMORY DEVICES

(76) Inventors: Hsu-Sheng Yu, 16 Li-Hsin Rd., Science-Based Industrial Park, Hsinchu (TW); Chun-Hung Lee, 16 Li-Hsin Rd., Science-Based Industrial Park, Hsinchu (TW)

(*) Notice: Subject to any disclaimer, the term of this patent is extended or adjusted under 35 U.S.C. 154(b) by 0 days.

(21) Appl. No.: 10/172,066

(22) Filed: Jun. 14, 2002

Related U.S. Application Data

(63) Continuation-in-part of application No. 10/137,226, filed on Apr. 30, 2002, now abandoned.

(51) Int. Cl.[7] .............................................. H01L 21/76
(52) U.S. Cl. ...................................... 438/412; 438/453
(58) Field of Search ................................ 438/201, 258, 438/412, 453, 588, 442, 444

(56) References Cited

U.S. PATENT DOCUMENTS 5,663,084 A * 9/1997 Yi et al.

* cited by examiner

Primary Examiner—David Nelms
Assistant Examiner—Phuc T. Dang
(74) Attorney, Agent, or Firm—Stout, Uxa, Buyan & Mullins, LLP

(57) ABSTRACT

A method for fabricating nonvolatile memory devices includes forming one or more polyislands, each having a conductive layer and a dielectric layer, on a dielectric layer of a substrate before the creation of control gates on the memory device. In particular, the polyislands may be formed by providing a substrate with a dielectric layer on a surface of the substrate, and forming one or more bar-like structures on the substrate. Each of the bar-like structures includes a conductive layer and a dielectric layer. The bar-like structures are then patterned with compositions having various etching sensitivities for the components of the bar-like structures, to thereby create one or more polyislands before the addition of a second conductive layer over the resulting structure.

30 Claims, 7 Drawing Sheets

METHODS OF FABRICATING MEMORY CELLS FOR NONVOLATILE MEMORY DEVICES

RELATED APPLICATION INFORMATION

This application is a continuation-in-part of U.S. application Ser. No. 10/137,226 filed Apr. 30, 2002 now abandoned and entitled METHODS OF FABRICATING MEMORY CELLS FOR NONVOLATILE MEMORY DEVICES.

BACKGROUND OF THE INVENTION

1. Field of the Invention

This application relates to methods of fabricating integrated circuit devices and, more particularly, to methods of fabricating memory cells for nonvolatile memory devices.

2. Description of Related Art

Nonvolatile memory devices are often used in electronic equipment due to their ability to store information in a memory cell even in the absence of power. One example of a nonvolatile memory device is an electrically erasable programmable read only memory (EEPROM) device. An example of an EEPROM device is a flash memory device.

Flash memory devices typically comprise a plurality of memory cells capable of storing electrical charge. The memory cells typically include a polycrystalline silicon (polysilicon) gate positioned over an insulating layer of silicon dioxide. The silicon dioxide layer is disposed over a semiconductor substrate, and the silicon dioxide layer may be referred to as a gate oxide layer or a tunnel oxide layer. The polysilicon gate positioned over the tunnel oxide layer may be called a floating gate. A second insulating layer is provided over the floating gate, and a second polysilicon gate is disposed over the second insulating layer. The second polysilicon gate may be called a control gate. Because the floating gate is electrically isolated between the two insulating layers, electrical charge stored on the floating gate is effectively trapped. The charges of the floating gates are controlled by the addition or removal of electrons from the floating gates. One process often used in changing the charges on the floating gates is Fowler-Nordheim tunneling, as is understood in the art.

Conventional methods for fabricating flash memory devices generally include first forming one or more bar-like structures on a semiconductor substrate having a tunnel oxide layer on one surface. The bar-like structures typically comprise a polysilicon layer and a dielectric structure disposed on the polysilicon layer. Thus, the polysilicon layer is disposed between the tunnel oxide layer and the dielectric structure. Subsequently, a second polysilicon layer and another insulative layer are disposed over the bar-like structures and the substrate to create a modified structure. The modified structure is then etched to create the isolated memory cells of the device. In other words, the isolated memory cells are created only after the addition of the second conductive layer and the insulative layer.

When these conventional methods are practiced, the resulting high aspect ratios (e.g., the depth to width ratios) and polysilicon stringers can become undesirable issues. For example, the individual memory cells are typically isolated by etching the modified structures and removing material between the cells. It is important to remove most, if not all, of the material on the tunnel oxide layer between the memory cells to permit the proper functioning of the memory device. As the height of the bar-like structures or memory cells increases, it becomes more difficult to remove material near the bottom of the memory cell (i.e., the area of the memory cell near the substrate). For example, when the memory cells are created after the addition of the second conductive layer and insulative later, as discussed above, it becomes difficult to completely isolate the memory cells. In one example, polysilicon stringers may remain after the etching processes. The stringers may provide contact between adjacent transistors, which may lead to electrical shorting paths between the transistors, and may induce problems in the functioning of the memory cells and the memory device.

In addition, because the etching rate of the anti-reflective coating (ARC) that is used in conventional methods is typically higher than that of silicon nitride ($Si_3N_4$) that may be used in the dielectric structure between the two polysilicon layers, the tunnel oxide and the semiconductor substrate may be damaged during etching for forming the memory cells.

Thus, there remains a need in the prior art for methods of fabricating memory cells that can address the conventional-methodology problems of, for example, reducing the difficulties in isolating high-aspect ratio memory cells and/or attenuating or eliminating stringers in the fabrication of those memory cells. In addition, a need remains in the prior art for memory-cell fabrication methods that can reduce or prevent damage to the tunnel oxide layer or the semiconductor substrate.

SUMMARY OF THE INVENTION

The present invention seeks to meet these needs by providing, among other things, methods of fabricating memory cells that isolate regions of the bar-like structures prior to the addition of the second conductive layer or control gate. Since the regions are isolated prior to the addition of the second conductive layer and insulating layer, the heights of the regions may be reduced compared to the heights of regions employing the above-discussed conventional methods. Consequently, more effective or complete isolation between the regions may be obtained. In addition, the occurrence of stringers should be attenuated or eliminated, since the ability to effectively etch the material between the regions is enhanced.

In one embodiment of the invention, a particular series of steps is provided that results in the selective etching of the various conductive layers and insulative layers, so that as a result the tunnel oxide layer and semiconductor substrate are minimally damaged, or not damaged at all.

The present invention provides methods for forming polyislands during, for example, the manufacture of nonvolatile memory devices, including flash memory devices. With particular reference to the disclosure herein, the term "polyislands" refers to isolated structures which are precursors to and which will eventually become integrated into memory cells. For example, polyislands may be formed into memory cells upon the addition of the second conductive layer (e.g., the control gate) and any additional insulative layers to the polyislands during manufacture of the memory cells. In accordance with one feature of the present invention, a polyisland may comprise a conductive layer and a dielectric layer disposed on the upper surface of the conductive layer. A plurality of polyislands are created by the parsing (e.g., etching of portions) of one or more polybars. As used herein, the term "polybars" refers to bar-like structures which are precursors to polyislands and which can comprise a conductive layer and a dielectric layer disposed on the conductive layer's upper surface. Polybars can be formed, for example, using conventional etching procedures as understood by persons skilled in the art, and can be formed to extend generally from one side to the opposite side of the semiconductor substrate.

In accordance with one aspect of the present invention, an integrated circuit manufacturing method comprises a step of providing a semiconductor substrate having a substrate dielectric layer on a surface, followed by a step of forming at least one polybar on the substrate dielectric layer. Each polybar comprises a polybar conductive layer and a polybar dielectric layer, wherein the polybar conductive layer is disposed between the substrate dielectric layer and the polybar dielectric layer. The method may further comprise a step of patterning the at least one polybar to create a plurality of polyislands, before the addition of a second conductive layer to the semiconductor substrate.

A method for manufacturing a nonvolatile memory device in accordance with another aspect of the present invention comprises a step of providing a semiconductor substrate having a substrate dielectric layer disposed on one surface of the semiconductor substrate; another step of forming a first conductive layer on the substrate dielectric layer; another step of forming a second dielectric layer on the first conductive layer; and yet another step of patterning the second dielectric layer and first conductive layer to create at least one polybar having a length extending along the surface of the substrate dielectric layer. The method includes a further step of patterning the at least one polybar perpendicularly to the length of the polybar to thereby create at least one polyisland, followed by a step of forming a second conductive layer over the second dielectric layer of the at least one polyisland.

The foregoing methods may also comprise a step of disposing an anti-reflective coating over the at least one polybar. The methods may also be performed using a plurality of gas plasmas. Each of the gas plasmas may preferably have an etching selectivity for at least one of the anti-reflective coating, the second dielectric layer, or the first conductive layer. For example, the methods may comprise a step of etching the anti-reflective coating and the at least one polybar with a gas plasma having an approximately equal etching sensitivity to the anti-reflective coating and the polybar dielectric layer. The methods may also comprise a step of etching the anti-reflective coating and the polybar dielectric layer with a gas plasma having a greater etching sensitivity for the polybar dielectric layer compared to the anti-reflective coating. In addition, the methods may further comprise a step of etching the polybar conductive layer with a gas plasma having a greater sensitivity for the polybar conductive layer compared to the substrate dielectric layer.

In one embodiment of the invention, a method for forming polyislands comprises a series of steps including a step of providing a semiconductor substrate having a tunnel oxide layer disposed thereon; and another step of forming a plurality of polybars on the tunnel oxide layer. Each polybar includes a polysilicon layer and a silicon nitride ($Si_3N_4$) layer disposed on the polysilicon layer. An ARC layer is then formed on the semiconductor substrate over the polybars. Then, the polybars (and the ARC layer) are patterned perpendicularly to form a plurality of polyislands. The polybars are patterned using a three step etching process, which comprises the steps of: (a) etching with $HBr/CF_4$ plasma as an etching gas plasma, wherein the etching selectivity between the ARC layer and the silicon nitride layer is approximately 1; (b) etching with $CF_4/CHF_3/Ar$ plasma as an etching gas plasma, wherein the etching selectivity of the silicon nitride layer over the ARC layer is larger than 5; and (c) etching with $HBr/He/He—O_2$ plasma as an etching gas plasma, wherein the etching selectivity of the polysilicon over the tunnel oxide is greater than 50.

The foregoing methods may be practiced using, for example, high density plasma etchers and/or magnetically-enhanced reactive ion etchers. The foregoing methods may also include, for example, one or more steps of implanting dopants to the substrate and the conductive layers, such as the polysilicon layers. The methods may be used, for example, in fabricating flash memory devices.

Thus, by way of the present invention, polyislands can-be formed before the addition of a second conductive layer, or control gate. The control gates, or word lines, may then be formed on the polyislands. Since the polyislands are formed first, the relatively high aspect ratios and the stringer issues can be reduced or eliminated during the patterning of the word lines. In addition, the methods of the present invention can reduce or prevent damage to the tunnel oxide layer and/or semiconductor substrate during the etching processes.

Any feature or combination of features described herein are included within the scope of the present invention provided that the features included in any such combination are not mutually inconsistent as will be apparent from the context, this specification, and the knowledge of one of ordinary skill in the art.

Additional advantages and aspects of the present invention are apparent in the following detailed description and claims.

DETAILED DESCRIPTION OF THE PRESENTLY PREFERRED EMBODIMENTS

Figure 1:
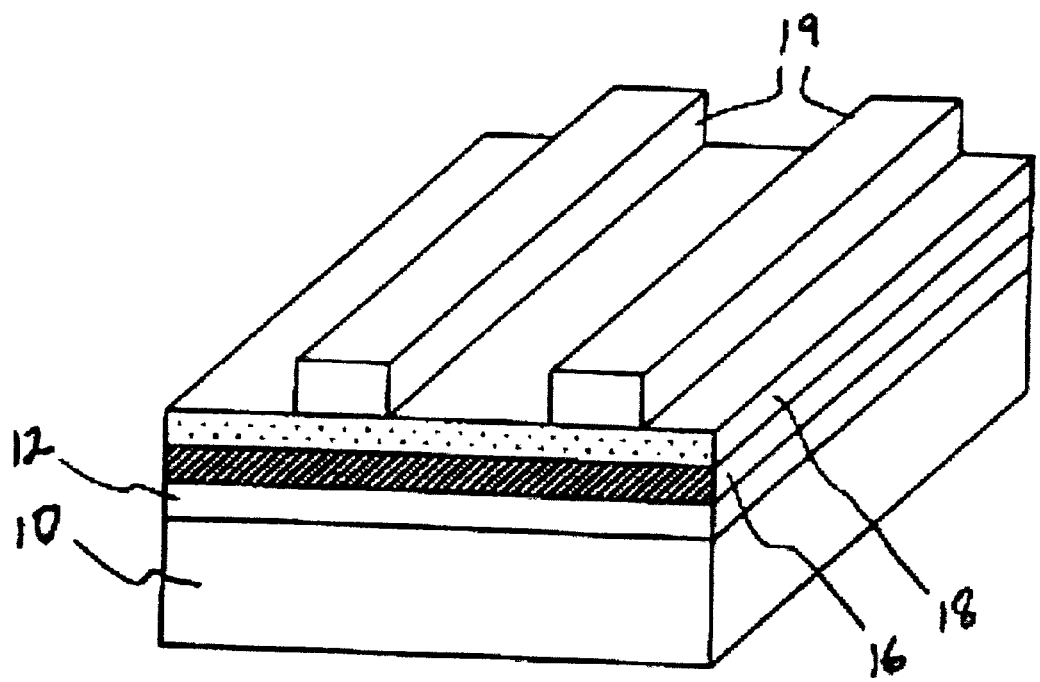
FIG. 1 is a perspective view of a semiconductor substrate used in the fabrication of a nonvolatile memory device.

Reference will now be made in detail to the presently preferred embodiments of the invention, examples of which are illustrated in the accompanying drawings. Wherever possible, the same reference numbers are used in the drawings and the description to refer to the same or like parts. It should be noted that the drawings are in greatly simplified form and are not to precise scale. In practice the flash memory device structure will be one of many supported on a common substrate connected with suitable metallurgy in various electronic circuit configurations. In reference to the disclosure herein, for purposes of convenience and clarity only, directional terms, such as, top, bottom, left, right, up, down, above, below, rear, and front, are used with respect to the accompanying drawings. Such directional terms should not be construed to limit the scope of the invention in any manner.

Although the disclosure herein refers to methods for fabricating polyislands for flash memory devices, it is to be understood that the methods may be useful in fabricating polyislands in any nonvolatile memory device that may use floating gates, or isolated charge storing devices. For example, the methods of the invention may be practiced in the fabrication of either stacked gate memory devices or split gate memory devices. It is to be understood and appreciated that the process steps and structures described herein do not cover a complete process flow for the manufacture of, for example, the flash memory device. The present invention can be practiced in conjunction with various integrated circuit fabrication techniques that are used in the art, and only so much of the commonly practiced process steps are included herein as are necessary to provide an understanding of the present invention.

Referring to the figures, and in particular, FIG. 1, a substrate 10 is provided with a tunnel oxide layer 12 disposed on one surface. Substrate 10 may be a semiconductor substrate. Tunnel oxide layer 12 is an insulative or dielectric layer. Substrate 10 may be fabricated from silicon, such as a monocrystalline silicon. Tunnel oxide layer 12 may be fabricated from silicon dioxide ($SiO_2$). A conductive layer 16 is disposed over tunnel oxide layer 12, and an insulative or dielectric layer 18 is disposed on the upper surface of conductive layer 16, as shown in FIG. 1. Conductive layer 16 may be fabricated from any suitable material capable of transmitting electrical current, including, but not limited to, polysilicon. Insulative layer 18 may be fabricated from any suitable insulative material that electrically insulates polysilicon layer 16, as discussed herein. Examples of materials used in making insulative layer 18 include, but are not limited to, silicon nitride ($Si_3N_4$), silicon dioxide ($SiO_2$), borophosphosilicate glass, phosphosilicate glass, borosilicate glass, or a composite layer or ONO layer (which is fabricated from layers of silicon oxide, silicon nitride, and silicon dioxide).

Figure 1A:
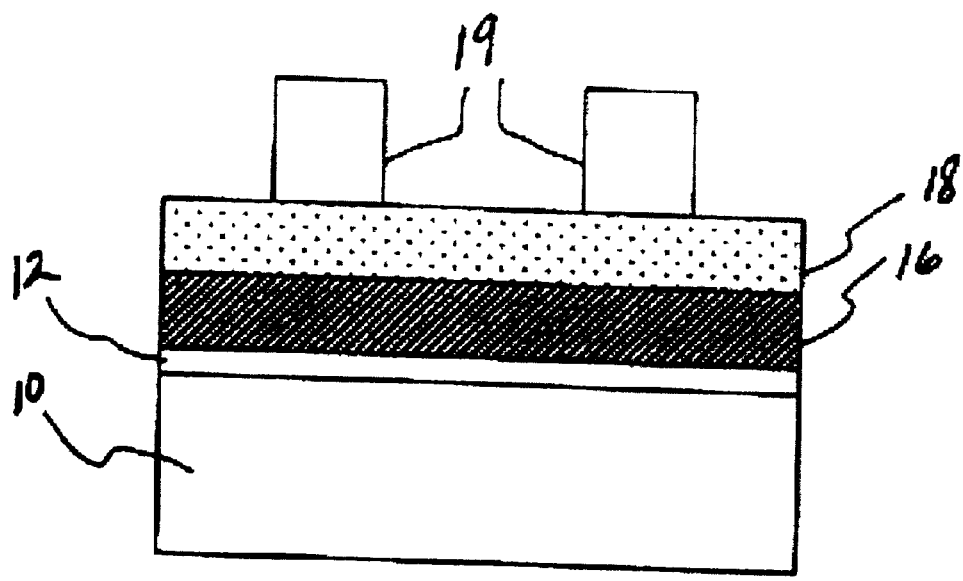
FIG. 1A is a front, plan view of the device of FIG. 1.

A plurality of mask bars 19 are positioned on top of dielectric layer 18, as depicted in FIG. 1. Bars 19 prevent removal of the material disposed under the bars during etching processes. In one embodiment, bars 19 may comprise photoresist, and bars 19 define one or more photoresist layers, in accordance with well known photolithography principles understood in the art. FIG. 1A depicts a front view of the device of FIG. 1.

The device illustrated in FIG. 1 may be prepared by forming or growing tunnel oxide layer 12 over substrate 10 using conventional methods known in the art. The thickness of tunnel oxide layer 12 may be between approximately 50 and 200 angstroms. Polysilicon layer 16 may then be formed over tunnel oxide layer 12 using conventional methods known in the art, such as by chemical vapor deposition (CVD), including low pressure CVD (LPCVD). Dielectric layer 18 may then be formed over polysilicon layer 16 using similar methods; for example, dielectric layer 18 may be grown or deposited on polysilicon layer 16. Polysilicon layer 16 may be between approximately 500 and 1500 angstroms, and dielectric layer 18 may be between approximately 50 and 2000 angstroms. Accordingly, one surface (e.g., the upper surface) of substrate 10 may be completely covered by tunnel oxide layer 12, polysilicon layer 16, and dielectric layer 18.

Figure 2:
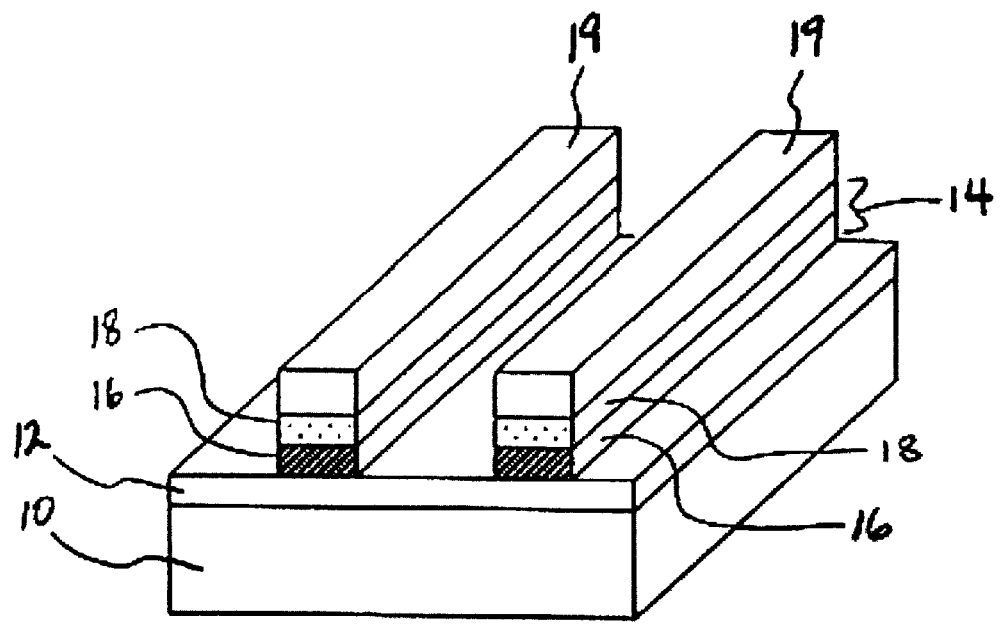
FIG. 2 is a perspective view similar to FIG. 1 illustrating two polybars after removal of dielectric and conductive layers from portions of the device.

The bars 19 originate with one or more photoresist layers being placed over dielectric layer 18. The photoresist layers are patterned into bars 19, which preferably are separated by one or more channels. Bars 19 may be etched using conventional methods, such as dry etching or wet etching, to create a plurality of rows or polybars 14 along tunnel oxide layer 12, as shown in FIG. 2. Accordingly, substrate 10 of FIG. 2 has a tunnel oxide layer 12 disposed on its upper surface, and polybars 14 disposed on the tunnel oxide layer. Polybars 14, comprising conductive layers 16 and dielectric layers 18, are defined beneath the bars 19. In an exemplary embodiment, polybars 14 comprise a polysilicon conductive layer 16 and a silicon nitride dielectric layer 18.

Figure 3:
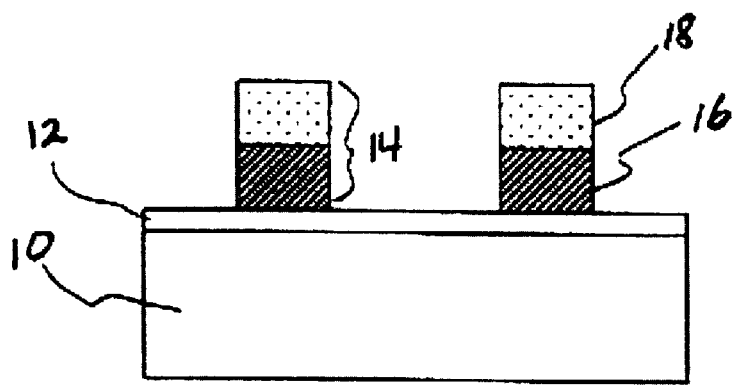
FIG. 3 is a front, plan view of the device of FIG. 2 after removal of photoresist.
Figure 4:
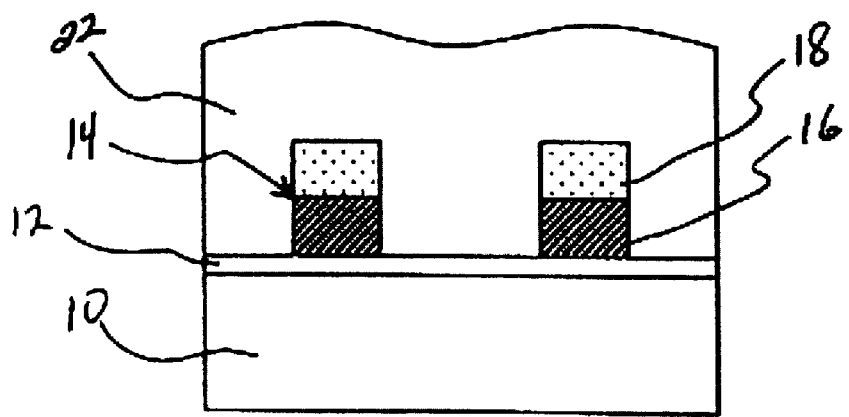
FIG. 4 is a front, plan view similar to FIG. 3 illustrating the addition of anti-reflective coating to the substrate.
Figure 5:
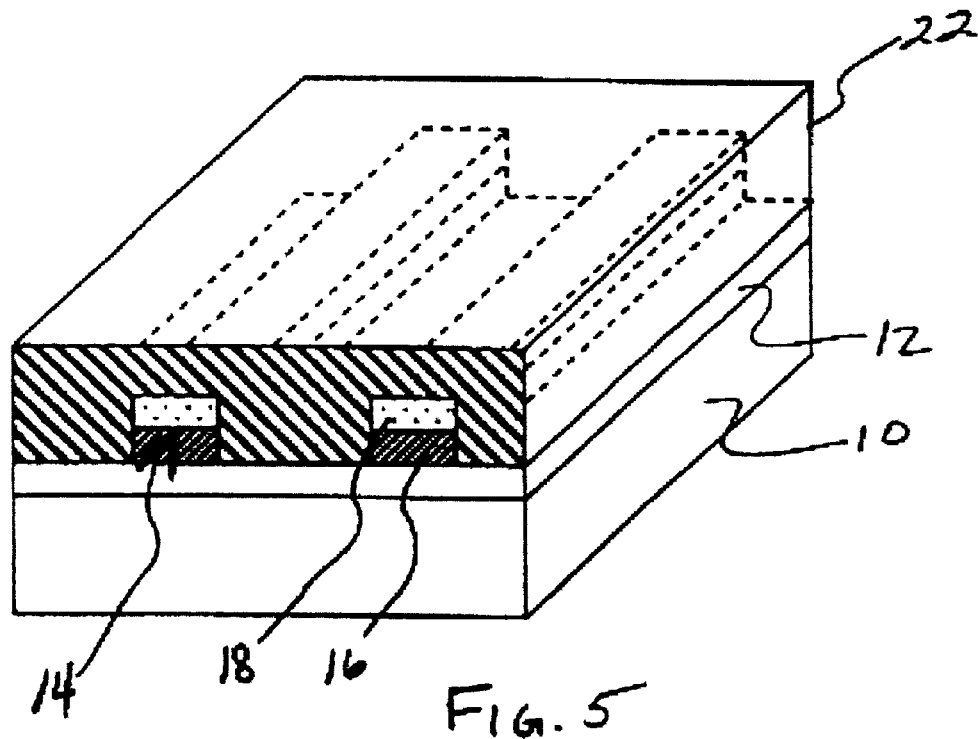
FIG. 5 is a perspective view of the device shown in FIG. 4.

Photoresist 19 may then be removed from polybars 14 by conventional methods known in the art, such as stripping. A front view of the device of FIG. 2 after the removal of photoresist 19 is illustrated in FIG. 3. An anti-reflective coating (ARC) 22, such as a bottom anti-reflective coating (BARC), may then be deposited on the device, as shown in FIG. 4 and FIG. 5. Anti-reflective coating 22 is highly absorbing, and preferably absorbs most of the radiation that penetrates the photoresist, thereby reducing reflective notching, standing wave effects and scattering of the radiation. One particular composition for ARC 22 is an organic ARC. Anti-reflective coating 22 may accordingly be disposed over polybars 14 as well as over the exposed tunnel oxide layer 12. In a preferred embodiment, anti-reflective coating 22 is formed over polybars 14 in an amount great enough to form a planar surface. For example, ARC 22 should extend above polybars 14 sufficiently to permit planarization of ARC 22 without planarizing polybars 14. In certain embodiments of the invention, planarization of ARC 22 may not be necessary to the extent that ARC 22 can be formed with a substantially, and preferably completely, planar surface sufficient to facilitate deposition of photoresist thereupon.

Figure 6:
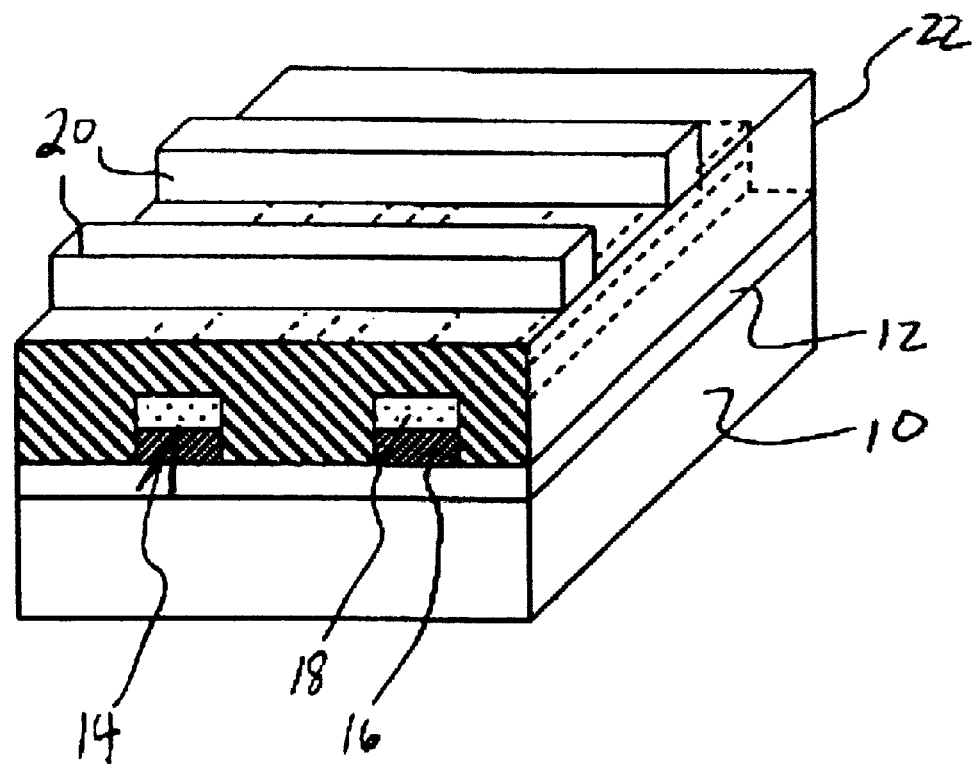
FIG. 6 is a perspective view similar to FIG. 5 illustrating the presence of two photoresist layers.
Figure 6A:
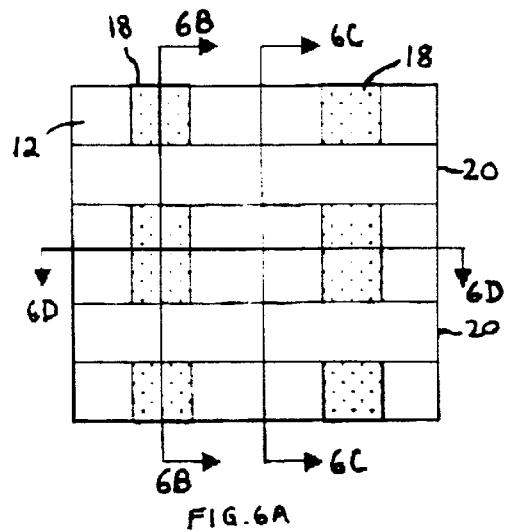
FIG. 6A is a top plan view of the device of FIG. 6.
Figure 6B:
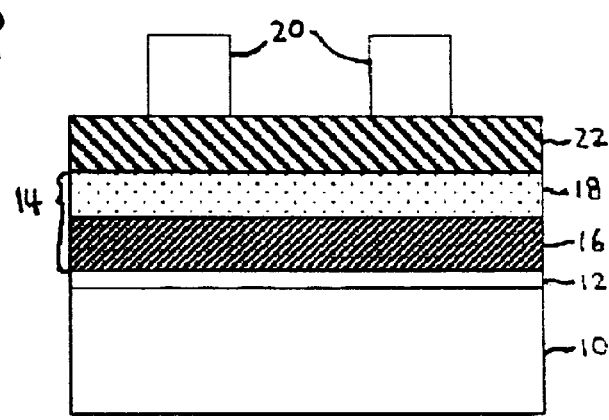
FIG. 6B is a sectional view along line 6B—6B of FIG. 6A.
Figure 6C:
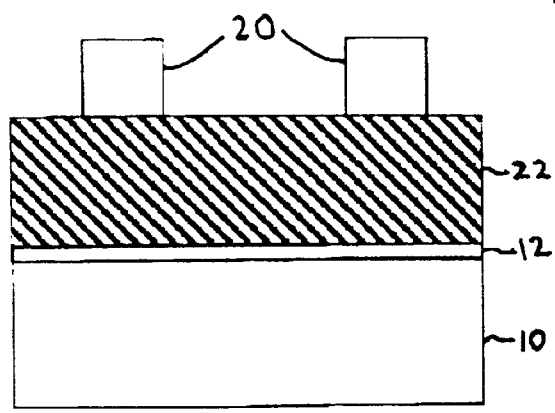
FIG. 6C is a sectional view along line 6C—6C of FIG. 6A.

After ARC 22 is deposited to form a planar surface, one or more photoresist layers 20 may be placed on ARC 22, as shown in FIG. 6. Photoresist layers 20 are preferably placed orthogonally to the length of polybars 14. A top view of the device of FIG. 6 is illustrated in FIG. 6A. Anti-reflective coating 22 is not illustrated in FIG. 6A for purposes of clarity. FIG. 6B illustrates a sectional view along line 6B—6B of FIG. 6A. In FIG. 6B, photoresist layers 20 are positioned on ARC 22 which is disposed over dielectric layer 18, conductive layer 16, tunnel oxide layer 12, and substrate 10. FIG. 6C illustrates a sectional view along line 6C—6C of FIG. 6A. FIG. 6C illustrates that ARC 22 essentially covers the entire surface of tunnel oxide layer 12 in regions not covered by polybars 14 and extends up to photoresist layers 20.

Figure 6D:
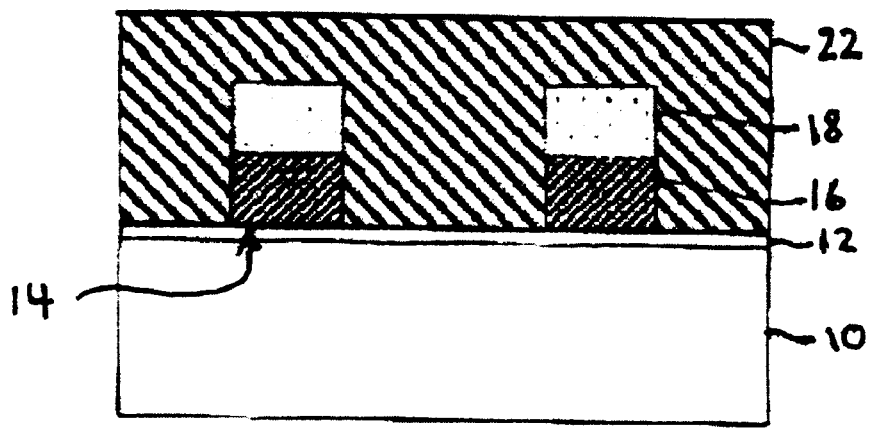
FIG. 6D is a sectional view along line 6D—6D of FIG. 6A.

FIG. 6D illustrates a sectional view along line 6D—6D of FIG. 6A. As shown in FIG. 6D, ARC 22 is disposed over polybars 14.

Portions of polybars 14 (and ARC 22) not covered by photoresist layers 20 may then be removed to create one or more polyislands, as discussed below. The exposed portions of polybars 14 may be removed using any known means of etching, including dry or wet etching, or any combination thereof. In other words, polybars 14 are patterned to create one or more polyislands. As used herein, "patterned" refers to the selective removal of one or more portions, such as portions of polybars 14, of the structure of interest, such as the nonvolatile memory device.

In a preferred embodiment, the exposed portions of polybars 14 (e.g., the portions of the polybars not covered by photoresist 20) are etched, preferably dry-etched, in a three-step etching process. The first step employs a gas plasma that has an approximately equal selectivity between ARC 22 and dielectric layer 18. In other words, the selectivity between the ARC 22 and dielectric layer 18 may be about 1. In one embodiment of the invention, anti-reflective coating 22 may be BARC, and dielectric layer 18 may be silicon nitride. In such an embodiment, the gas plasma may be $HBr/CF_4$ plasma. The etching gas plasma may provide HBr at a flow rate of 10–20 standard cubic centimeters per minute (sccm) and $CF_4$ at 70–90 sccm. The gas pressure may be between approximately 10–20 mTorr. The top power may be between 650 and 750 W, and the bottom power may be between 140–160 W. A high density plasma (HDP) etcher may be used to perform this etching step. The etching of this first step removes exposed portions of both ARC 22 and dielectric layer 18 in a nonpreferential or nonselective manner due to the approximately equal selectivity of the etching gas plasma. Thus, the regions of the device not covered by photoresist layers 20 are etched. The etching is performed for a duration sufficient to at least expose the polybar 14 regions having the dielectric layer 18 that are not covered by photoresist layers 20. The etching may be performed for longer durations to provide more removal of ARC 22. The etching may even be performed long enough to remove ARC 22 to expose regions of tunnel oxide layer 12 that are not covered by photoresist layers 20.

The second etching step employs a gas plasma having an etching selectivity between polybar dielectric layer 18 and ARC 22 greater than 1 and, more preferably, greater than about 3. In a presently preferred embodiment, the sensitivity of the dielectric layer 18 to this plasma is about 5 times greater than the ARC 22. In an embodiment having a silicon nitride dielectric layer 18 and BARC 22, a $CF_4/CHF_3/Ar$ plasma may be used. The $CF_4$ of this plasma may be provided at a flow rate of 10–20 sccm $CF_4$, the $CHF_3$ may be provided at a flow rate of 50–70 sccm, and the Ar may be provided at a flow rate between 100–200 sccm. The gas pressure during etching may be between 100–150 mTorr. The bottom power may be between 500–700 W. One tool used in the second etching step may be a magnetically-enhanced reactive ion etch (MERIE) etcher. The etching duration of the second etching step is preferably long enough to completely remove the exposed regions of dielectric layer 18 (e.g., the regions that are not covered by photoresist layers 20). The complete removal of dielectric layer 18 results in the exposure of conductive layer 16. To the extent the unmasked portions of dielectric layer 18 are removed by the first etching step, the second etching step can be omitted.

The third etching step preferably employs a gas plasma having a selectivity between polybar conductive layer 16 and tunnel oxide layer 12 greater than 20 and, preferably greater than 40. In a presently preferred embodiment, the conductive layer 16 is more than 50 times more sensitive to the plasma than the tunnel oxide layer 12. In an embodiment of the invention in which conductive layer 16 is a polysilicon layer, a $HBr/He/He-O_2$ plasma may be used. This plasma may provide HBr at a flow rate between 150–250 sccm, He at a flow rate between 50–150 sccm, and $He/O_2$ at a flow rate between 3–10 sccm. The gas pressure may be between 60–80 mTorr, the top power may be between 300–400 W, and the bottom power may be between 60–90 W. One tool used in the third etching step may be a HDP etcher. The third etching step minimally damages, and preferably does not damage, the tunnel oxide layer 12 due to the higher selectivity of the gas plasma for polysilicon. The third etching step accordingly results in the complete removal of regions of polybar conductive layer 16 that are not covered by photoresist layers 20.

Although the three-step etching process set forth above is described utilizing a series of gas plasmas having relatively specific selectivities, other embodiments of the invention may use different etching mechanisms, different selectivities and/or different ratios of selectivity, and may include a fewer or greater number of etching steps. In accordance with one aspect of the present invention, the various etching techniques may be implemented to create the polyislands, so long as the risk of the tunnel oxide layer and substrate becoming damaged during the etching process is minimized.

For example, an initial etching step may comprise applying a gas plasma having a selectivity for both the dielectric and the arc but a greater selectivity for the dielectric, followed by a step of etching with the gas plasma until the conductive layer is exposed. A gas plasma that is highly selective to the conductive layer over the oxide layer is subsequently applied to remove exposed portions of the conductive layer. Furthermore, in practicing the foregoing method of implementing various protocols to selectively remove material beneath the photoresist, a relatively non-selective etching gas plasma may be applied until the dielectric layer is removed (e.g., even though some of ARC may remain). Next, the structure may be etched with one or more etching gas plasmas that have selectivities sufficient to remove the exposed portions of the conductive layer and/or the remaining portions of the exposed ARC.

Figure 7:
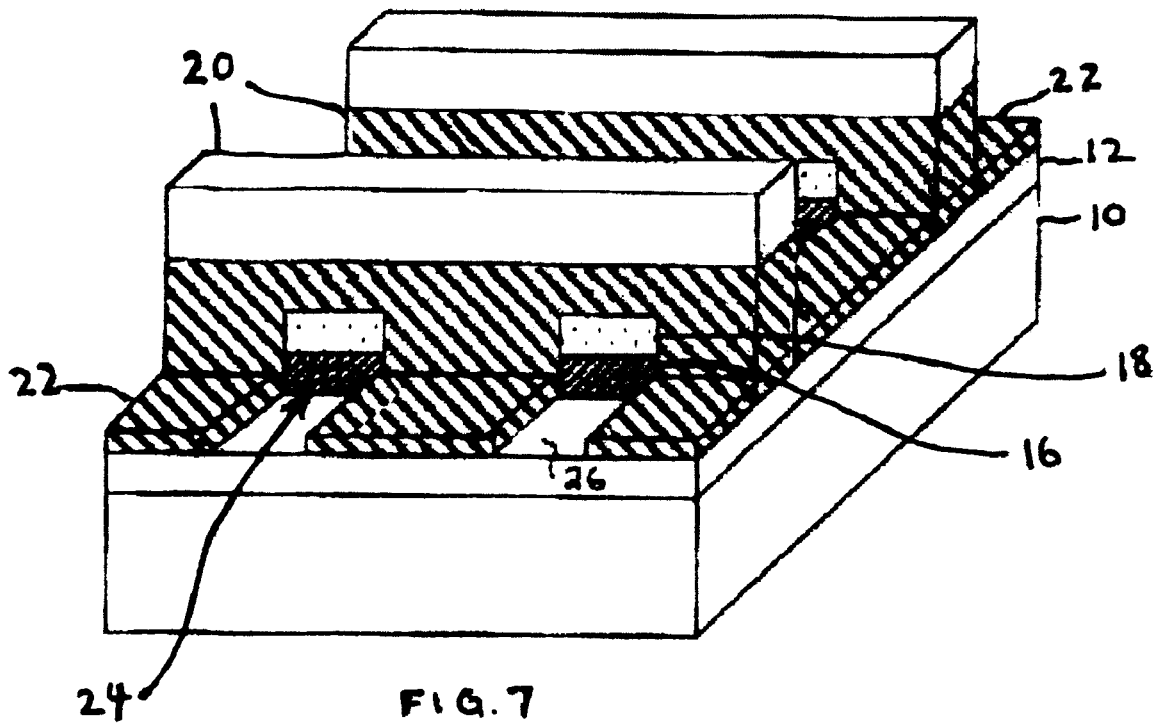
FIG. 7 is a perspective view similar to FIG. 6 illustrating the structure of the device after the etching of the polybars.

The device after the three etching steps is illustrated in FIG. 7. Polybars 14 have been etched to create a plurality of polyislands 24, as shown in FIG. 7. In the construction shown in FIGS. 7 and 8A–8D, the etching of ARC 22 is terminated early (i.e., after polybars have been etched down to the tunnel oxide layer), leaving a residual layer of ARC 22 disposed on tunnel oxide layer 12. The residual layer of ARC 22, if provided, may provide additional passivation, i.e., an additional protective layer, for the semiconductor substrate.

Figure 8A:
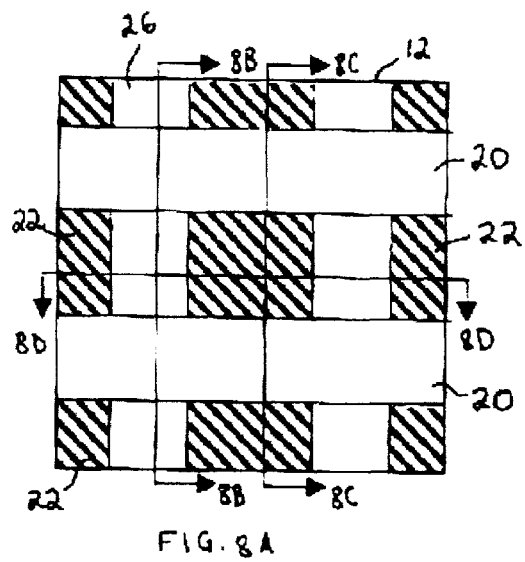
FIG. 8A is a top plan view of the device of FIG. 8 that has had the anti-reflective coating removed.

FIG. 8A illustrates a top view of the device of FIG. 7. FIG. 8A shows channels 26 that were previously covered by the polybar conductive layer 16 and the dielectric layer 18 (e.g., the construction of FIG. 6), before the three-step etching process. The channels 26, which extend generally perpendicularly to the photoresist layers 20, do not have a significant amount of, if any, ARC. Accordingly, channels 26 comprise exposed regions of tunnel oxide layer 12.

Figure 8B:
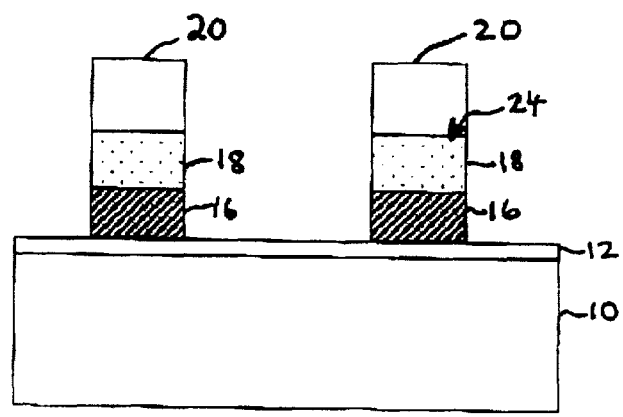
FIG. 8B is a sectional view along line 8B—8B of FIG. 8A.
Figure 8C:
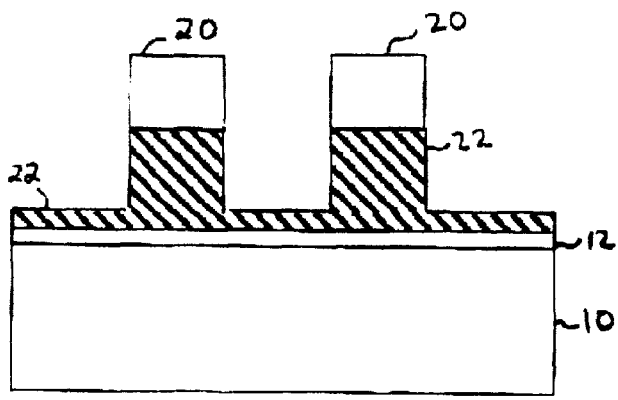
FIG. 8C is a sectional view along line 8C—8C of FIG. 8A.
Figure 8D:
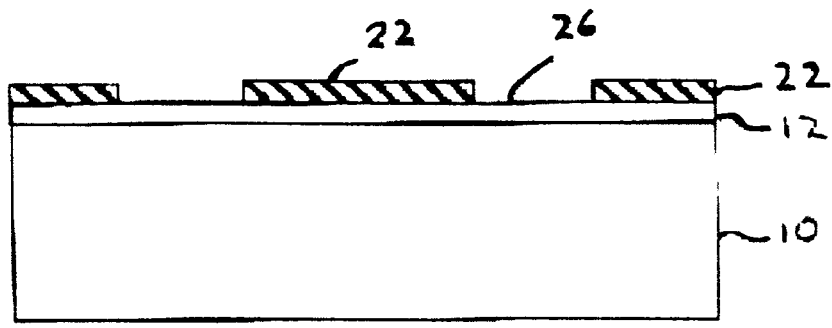
FIG. 8D is a sectional view along line 8D—8D of FIG. 8A.

FIG. 8B is a sectional view along line 8B—8B of FIG. 8A. From the view of FIG. 8B, it can be seen that the channel 26 is free of anti-reflective coating 22. FIG. 8C is a sectional view along line 8C—8C of FIG. 8A, showing portions of ARC 22 disposed between polyislands 24. FIG. 8D is a sectional view along line 8D—8D of FIG. 8A. As illustrated, the three step etch was conducted until the polybars 24 were etched down to the tunnel oxide layer 12, at which time the etch was terminated leaving a thin layer of ARC 22 on portions of the tunnel oxide layer 12.

Figure 9:
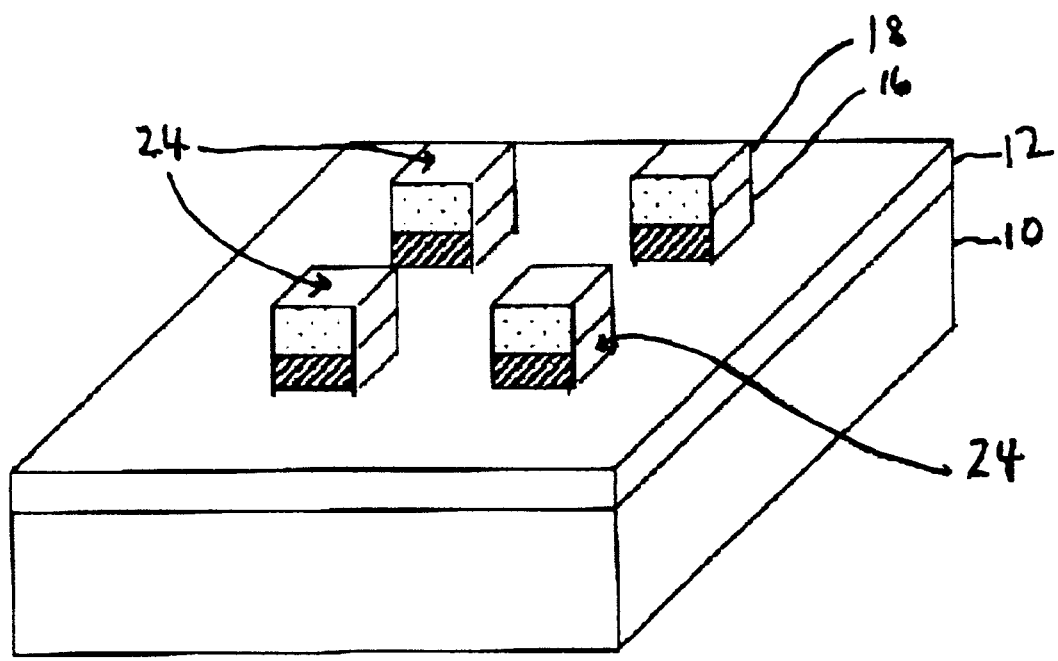
FIG. 9 is a perspective view similar to FIG. 8 with the anti-reflective coating removed.

Turning to FIG. 9, the photoresist layer 20 and ARC 22 have been removed, to thereby yield a plurality of isolated polyislands 24 on tunnel oxide layer 12. In the illustrated embodiment, all of the ARC layer 22 has been removed following removal of the photoresist layer 20; however, as indicated above, some ARC may be left in place, either between or on sides of the polyislands 24 and/or as a residual layer over part of the oxide layer 12, to provide additional passivation. The conductive layers 16 of polyislands 24 will become the floating gates and memory cells used in the memory device.

In manufacturing the memory device, one or more optional insulating layers may be formed or deposited over polyislands 24 and tunnel oxide layer 12. The insulating layer(s) may then have a second conductive layer formed thereupon. A further insulating layer may then be deposited or formed over the second conductive layer. The conductive and insulating layers may then undergo additional mask/etch processing to create a plurality of control gates over each of the floating gates on polyislands 24. In other embodiments, the second conductive layer may be formed directly over the dielectric layers 18 of the polyislands. In addition, the methods may include additional steps of implanting either P-type or N-type dopants to the silicon substrate, floating gate, and/or control gate, as is readily understood in the art.

The present method may depart from conventional methods of fabricating floating gates and memory cells in that the polyislands are formed before the fabrication of the control gates. As discussed herein, conventional methods may create a polybar and form the control gates over the polybar before etching the memory cells. In this manner, the etching may result in relatively high aspect ratios and development of stringers. In contrast, the present invention endeavors to create the polyislands before forming the control gates. Importantly, creating the polyislands first may allow one to avoid the high aspect ratio and stringer issues which may be associated with conventional methods. In addition, the specific etching recipe used to create the polyislands in accordance with the present invention may prevent or attenuate risks of the tunnel oxide layer and substrate becoming damaged during the etching process.

While this invention has been described with respect to various specific examples and embodiments, it is to be understood that the invention is not limited thereto and that it can be variously practiced with the scope of the following claims.

What is claimed is:

1. A method for forming polyislands on a substrate for a nonvolatile memory device, the method comprising the following steps:
   (a) providing a substrate having a substrate dielectric layer disposed on a surface of the substrate;
   (b) forming at least one polybar on the substrate dielectric layer, wherein the at least one polybar comprises a polybar conductive layer and a polybar dielectric layer, the polybar conductive layer being disposed between the substrate dielectric layer and the polybar dielectric layer; and
   (c) patterning the at least one polybar to create a plurality of polyislands before the addition of a second conductive layer to the substrate.

2. The method of claim 1, further comprising a step of disposing an anti-reflective coating over the at least one polybar prior to step (c).

3. The method of claim 2, wherein step (c) comprises a step of etching the anti-reflective coating and the at least one polybar with a gas plasma having an approximately equal etching sensitivity to the anti-reflective coating and the polybar dielectric layer.

4. The method of claim 3, wherein step (c) further comprises a step of etching the anti-reflective coating and the polybar dielectric layer with a gas plasma having a greater etching sensitivity for the polybar dielectric layer compared to the anti-reflective coating.

5. The method of claim 4, wherein step (c) further comprises a step of etching the polybar conductive layer with a gas plasma having a greater sensitivity for the polybar conductive layer compared to the substrate dielectric layer.

6. The method of claim 1, wherein the at least one polybar comprises a plurality of polybars, and the method further comprises a step of disposing an anti-reflective coating over the plurality of polybars prior to step (c).

7. The method of claim 6, wherein step (c) comprises a step of etching the anti-reflective coating and the plurality of polybars with a gas plasma having an approximately equal etching sensitivity to the anti-reflective coating and the polybar dielectric layer.

8. The method of claim 7, wherein step (c) further comprises a step of etching the anti-reflective coating and the polybar dielectric layer with a gas plasma having a greater etching sensitivity for the polybar dielectric layer compared to the anti-reflective coating.

9. The method of claim 8, wherein step (c) further comprises a step of etching the polybar conductive layer with a gas plasma having a greater sensitivity for the polybar conductive layer compared to the substrate dielectric layer.

10. The method of claim 1, wherein the nonvolatile memory device is a flash memory device.

11. A method for manufacturing a nonvolatile memory device comprising the following steps:
   (a) providing a semiconductor substrate having a substrate dielectric layer disposed on a surface of the substrate;
   (b) forming a first conductive layer on the substrate dielectric layer;
   (c) forming a second dielectric layer on the first conductive layer;
   (d) patterning the second dielectric layer and the first conductive layer to create at least one polybar having a length extending along a surface of the substrate dielectric layer;
   (e) patterning the at least one polybar substantially perpendicularly to the length of the at least one polybar to thereby parse the at least one polybar into at least one polyisland; and
   (f) forming a second conductive layer over the second dielectric layer of the at least one polyisland.

12. The method of claim 11, wherein the patterning of step (e) comprises at least two etching steps.

13. The method of claim 11, further comprising a step of forming an anti-reflective coating over the polybars before step (e).

14. The method of claim 13, wherein step (e) is followed by a step of removing substantially all of the anti-reflective coating from an upper surface of the second dielectric layer followed by a step of removing portions of the second dielectric layer.

15. The method of claim 13, wherein following step (e) a layer of the anti-reflective coating remains on substantially all of the substrate dielectric layer that was not covered by the polybars.

16. The method of claim 13, wherein the patterning of step (e) is performed using a plurality of gas plasmas, at least one of the gas plasmas having an etching selectivity for either the anti-reflective coating, the second dielectric layer, or the first conductive layer.

17. The method of claim 13, further comprising a step of implanting a dopant to the substrate and the first and second conductive layers.

18. The method of claim 11, wherein the at least one polybar comprises a plurality of polybars.

19. The method of claim 18, wherein the at least one polyisland comprises a plurality of polyislands.

20. A method for forming polyislands on a substrate for a nonvolatile memory device, the method comprising the following steps:
  (a) providing a substrate having an oxide layer disposed thereupon;
  (b) forming a plurality of bar-like structures on the substrate oxide layer, wherein each bar-like structure extends in a first direction and includes a polysilicon layer and a top layer above the polysilicon layer;
  (c) forming a bottom anti-reflective coating (BARC) layer on the substrate over the plurality of bar-like structures; and
  (d) patterning the bar-like structures substantially perpendicularly to the first direction to thereby form a plurality of polyislands, wherein patterning of the bar-like structures comprises performing a first etching process, of which an etching selectivity between the anti-reflective coating layer and the top layer is about 1, and then performing a second etching process, of which an etching selectivity between the top layer and the anti-reflective coating layer is larger than 5, and then performing a third etching process, of which an etching selectivity between the polysilicon layer and the substrate oxide layer is larger than 50.

21. The method of claim 20, wherein the first etching process uses HBr at a flow rate between 10–20 sccm and $CF_4$ at a flow rate between 70–90 sccm as a gas source of an etching plasma.

22. The method of claim 21, wherein the gas pressure of the first etching process is 10–20 mTorr.

23. The method of claim 21, wherein the first etching process is performed in a high density plasma etcher.

24. The method of claim 20, wherein the second etching process uses $CF_4$ at a flow rate between 10–20 sccm, $CHF_3$ at a flow rate between 50–70 sccm, and Ar at a flow rate between 100–200 sccm as a gas source of an etching plasma.

25. The method of claim 24, wherein the gas pressure of the second etching process is 100–150 mTorr.

26. The method of claim 24, wherein the second etching process is performed in a magnetically-enhanced reactive ion etch etcher.

27. The method of claim 20, wherein the third etching process uses HBr at a flow rate between 150–250 sccm, He at a flow rate between 50–150 sccm, and $He/O_2$ at a flow rate between 3–10 sccm as a gas source of an etching plasma.

28. The method of claim 27, wherein the gas pressure of the third etching process is 60–80 mTorr.

29. The method of claim 27, wherein the third etching process is performed in a high density plasma etcher.

30. The method of claim 20, wherein the top layer comprises silicon nitride.

* * * * *